(12) United States Patent
Braun

(10) Patent No.: US 7,154,771 B2
(45) Date of Patent: Dec. 26, 2006

(54) METHOD OF SWITCHING AN MRAM CELL COMPRISING BIDIRECTIONAL CURRENT GENERATION

(75) Inventor: Daniel Braun, Paris (FR)

(73) Assignees: Infineon Technologies AG, Munich (DE); Altis Semiconductor, Corbeil Besonnes Cedex (FR)

( * ) Notice: Subject to any disclaimer, the term of this patent is extended or adjusted under 35 U.S.C. 154(b) by 5 days.

(21) Appl. No.: 11/054,112

(22) Filed: Feb. 9, 2005

(65) Prior Publication Data

US 2006/0176733 A1  Aug. 10, 2006

(51) Int. Cl.
*G11C 11/00* (2006.01)
(52) U.S. Cl. .................. 365/158; 365/171; 365/173
(58) Field of Classification Search ............... None
See application file for complete search history.

(56) References Cited

U.S. PATENT DOCUMENTS

| | | | |
|---|---|---|---|
| 6,052,302 A * | 4/2000 | Moyer et al. ............... 365/173 |
| 6,130,835 A * | 10/2000 | Scheuerlein ............... 365/171 |
| 6,269,018 B1 * | 7/2001 | Monsma et al. ........... 365/145 |
| 6,531,723 B1 | 3/2003 | Engel et al. |
| 6,545,906 B1 | 4/2003 | Savtchenko et al. |
| 6,667,899 B1 * | 12/2003 | Subramanian et al. ...... 365/158 |
| 6,914,810 B1 * | 7/2005 | Hosotani ..................... 365/173 |
| 2002/0036331 A1 * | 3/2002 | Nickel et al. ............... 257/421 |
| 2004/0213040 A1 * | 10/2004 | Oh et al. ..................... 365/158 |
| 2005/0207218 A1 * | 9/2005 | Lung et al. ................. 365/173 |

* cited by examiner

*Primary Examiner*—Son L. Mai
(74) *Attorney, Agent, or Firm*—Dicke, Billig & Czaja, PLLC

(57) ABSTRACT

The present invention relates to a method of switching a magnetoresistive memory (MRAM) cell including the following steps: providing an MRAM cell having a magnetic tunnel junction including first and second magnetic regions; the first magnetic region exhibiting a fixed magnetization, the second magnetic region exhibiting a free magnetization which is free to be switched between the same and opposite directions with respect to the fixed magnetization of the first magnetic region; the free magnetization being magnetically coupled to magnetic fields generated by first and second currents made to flow through first and second current lines, respectively; switching of the free magnetization by currents made to flow through the first and second current lines; and inverting of flowing directions of first and/or second currents for the switching of the free magnetization such that a respective time-averaged mean value of the first and/or second currents becomes essentially equal to zero.

18 Claims, 4 Drawing Sheets

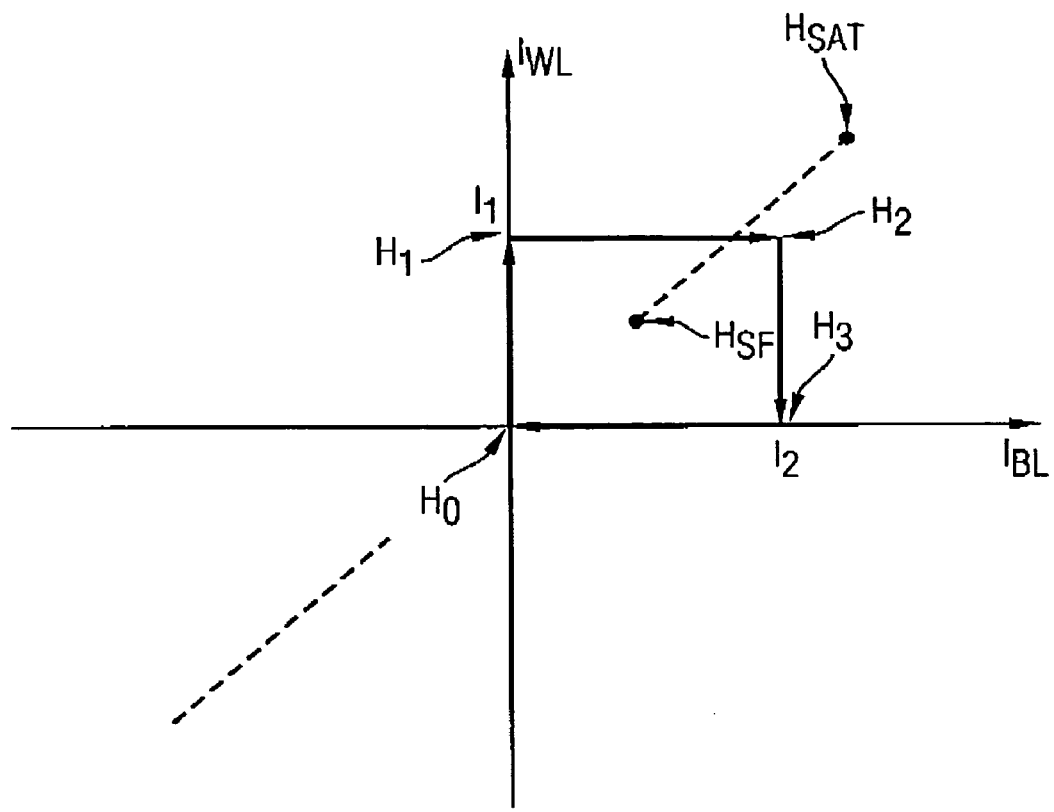

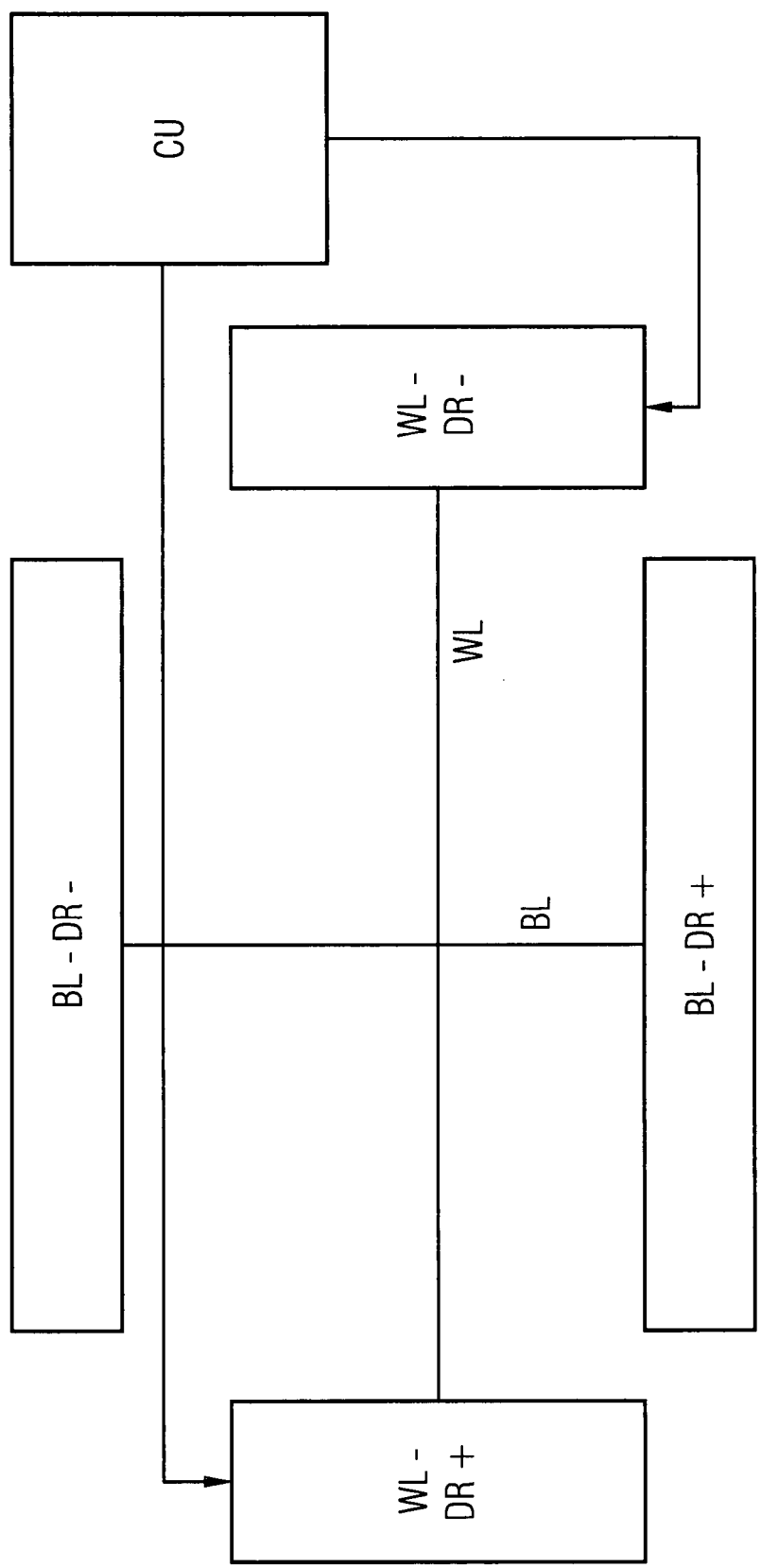

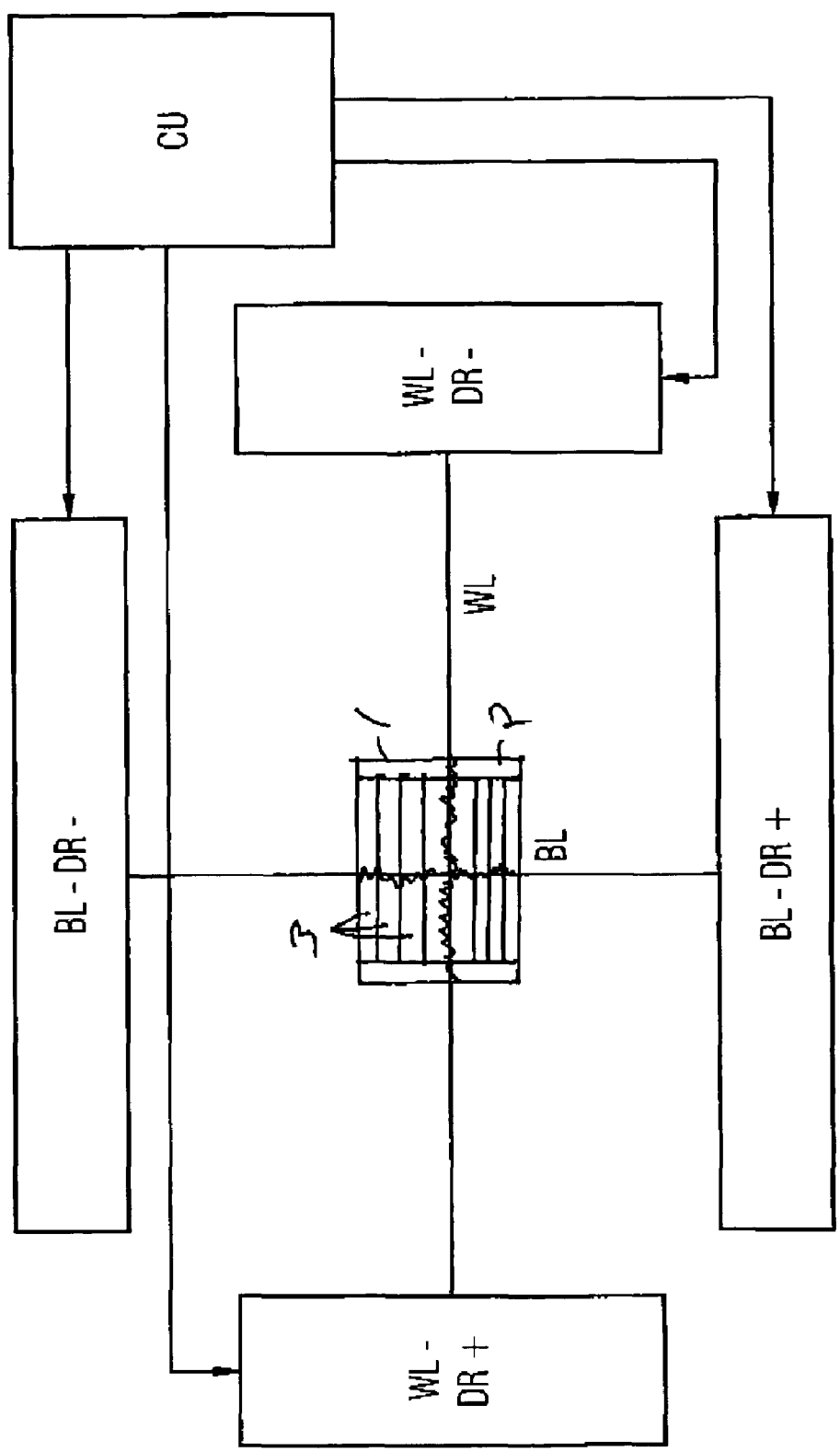

METHOD OF SWITCHING AN MRAM CELL COMPRISING BIDIRECTIONAL CURRENT GENERATION

FIELD OF THE INVENTION

The present invention pertains to non-volatile semiconductor magnetoresistive random access memory (MRAM) chips, and more particularly, a method of switching magnetoresistive memory cells for use in a semiconductor integrated circuit.

BACKGROUND

MRAM technology is a non-volatile random access memory technology that may replace present random access memories as the standard memory technology for computing devices. An MRAM cell (also referred to as a tunneling magnetoresistive or TMR-device) includes a structure having ferromagnetic layers respectively exhibiting a resultant magnetic moment vector separated by a non-magnetic layer (tunneling barrier) and arranged into a magnetic tunnel junction (MTJ). In contrast to non-volatile DRAM memory technology, digital information is not stored by power but rather is represented in the MRAM cell as directions of magnetic moment vectors (magnetization) in the ferromagnetic layers. More specifically, the magnetic moment vector of one ferromagnetic layer is magnetically fixed (or pinned), while the magnetic moment vector of the other ferromagnetic layer is free to be switched between the two preferred directions in the magnetization easy axis, which typically is arranged to be aligned with the fixed magnetization of the reference layer. In other words, a memory state of an MRAM cell is maintained by the direction of the magnetization of the free layer with respect to the direction of the magnetization of the reference layer.

Depending upon the two different magnetic states of the free layer, the MRAM cell exhibits two different resistance values in response to a voltage applied across the magnetic tunneling junction barrier. Accordingly, the particular resistance of the TMR-device reflects the magnetization state of the free layer, wherein the resistance is lower when the magnetization of the free layer is parallel to the magnetization of the reference layer, and higher when magnetizations are antiparallel. Hence, a detection of changes in resistance allows to provide information stored in the MRAM cell.

In order to switch MRAM cells, magnetic fields which are coupled to the freely switchable magnetization of the magnetic free layer are applied. The magnetic fields typically are generated by supplying currents to current lines, e.g., write bit and write word lines, crossing at right angles with an MRAM cell being positioned in an intermediate position therebetween and at an intersection thereof.

To be useful in electronic devices, MRAM cells must be arranged in high-density cell arrays. Accordingly, a further down-scale of individual MRAM cells, exhibiting a minimum feature size of about 65 nm or even less, is one of the most prominent aims to bring MRAM cells into practical use.

However, down-scaling MRAM cells to realize a minimum feature size being as small as 65 nm or below, causes severe problems as to the electromigration of the switching currents. In fact, it is expected that due to current density limitations because of the electromigration phenomenon, the switching currents will have to scale down to a level of about 0.5 mA.

Otherwise, down-scaling the MRAM cells requires smaller and smaller magnetic tunnel junctions, since for a given aspect ratio and given free layer thickness the magnetic switching fields increase roughly like $$\frac{1}{\sqrt{w}}$$

or $$\frac{1}{w},$$

depending on the cell concept, where w is the width of the memory cell. More specifically, field selected switching becomes ever harder in case the width w of the memory is decreased requiring large switching currents.

Accordingly, down-scaling the MRAM cells requires large switching currents on the one hand which, however, are likely to induce electromigration phenomena on the other hand.

Until now, no solution as to the problem regarding prevention of electromigration of the switching currents in down-scaling MRAM cells has been offered. Future concepts as to high-dense MRAM cell arrays in the 65 nm minimum feature size technology and even below rather are based on the hope of still finding appropriate switching mechanisms which enable switching of the MRAM cells supplying smaller switching currents having a reduced tendency with respect to the undesired electromigration phenomenon which may even prevent the practical usage of high-dense MRAM cell arrays.

In light of the above, there is a need for methods of switching (writing) MRAM cells allowing a further cell size down-scale, in particular in realizing a 65 nm feature size technology or below, without thereby causing severe problems as to the undesired electromigration phenomenon.

SUMMARY

The present invention provides a magnetic memory and method of switching a magnetic memory. In one embodiment, the method of switching a magnetic memory includes switching a free magnetization between a same and opposite directions with respect to a fixed magnetization by making first and second currents to flow through a first and second current line. The flowing directions of both first and second currents are inverted for the switching of the free magnetization such that a respective time-averaged mean value of said first and second currents becomes essentially equal to zero.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 1A illustrates a stability diagram of a prior art memory cell.

FIG. 2 illustrates one exemplary embodiment of a system having a memory according to the invention.

FIG. 3 illustrates another embodiment of a system having a memory according to the invention.

DETAILED DESCRIPTION

Figure 1B:
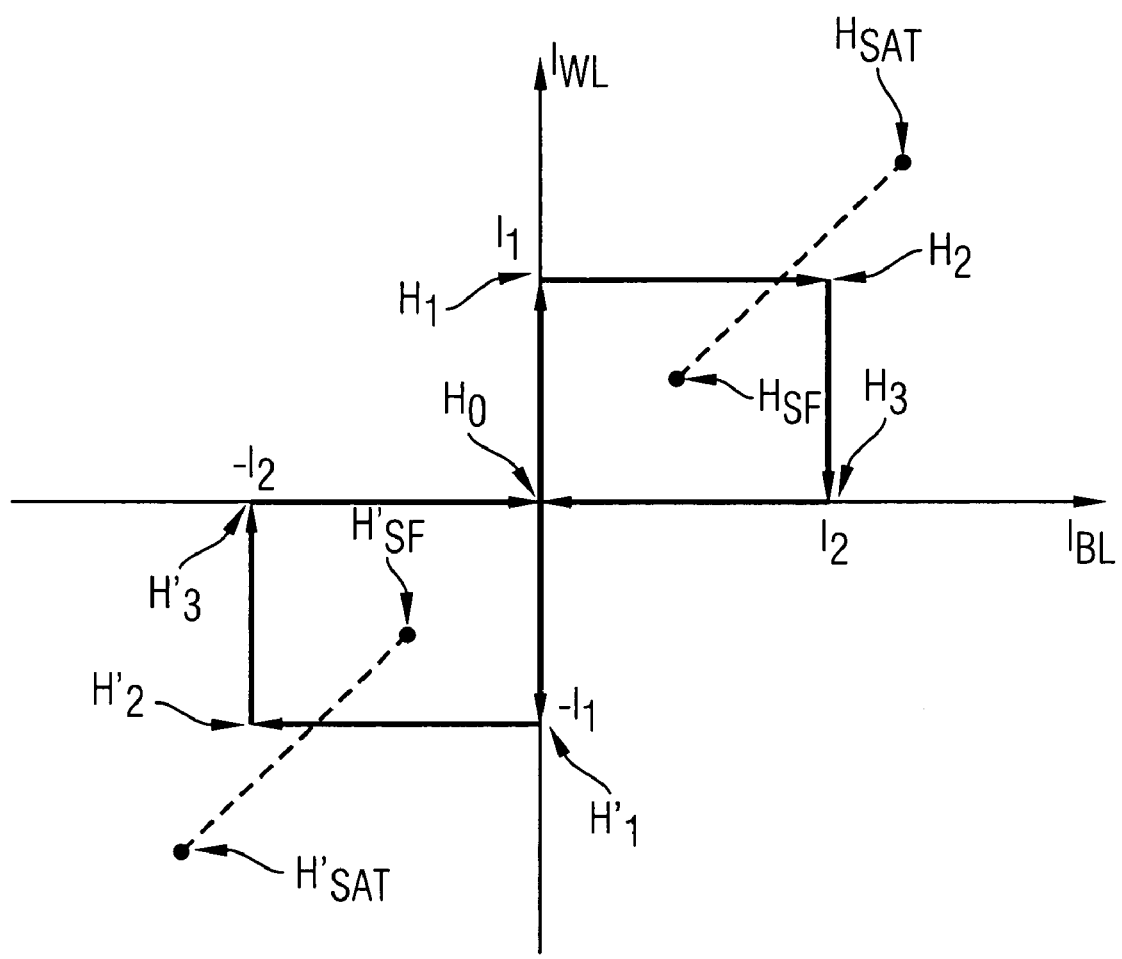
FIG. 1B illustrates one exemplary embodiment of a stability diagram of a memory cell according to the invention.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

According to one embodiment of the invention, a method of switching (writing) a magnetoresistive random access memory (MRAM) cell includes providing an MRAM cell having a magnetic tunnel junction that includes first and second magnetic regions made of magnetic material being stacked in a parallel, overlying relationship and separated by a tunneling barrier layer made of non-magnetic material. In above magnetic tunnel junction, the first magnetic region exhibits a fixed magnetization (or magnetic moment vector) being positioned adjacent the tunneling barrier layer on one side thereof and the second magnetic region exhibits a free magnetization (or magnetic moment vector) which is adjacent the tunneling barrier layer on the other side thereof. Contrary to the fixed magnetization which is pinned for not being switchable, for instance by antiferromagnetic pinning action, the free magnetization is free to be switched between its two preferred directions of the magnetization easy axis, which typically is in a parallel alignment to the fixed magnetization. In other words, the free magnetization is free to be switched between the same and opposite directions with respect to the fixed magnetization of the first magnetic region. For the switching thereof, the free magnetization is magnetically coupled to magnetic fields that are generated by first and second currents made to flow through first and second current lines, respectively, with current lines preferably crossing at right angles. For magnetically coupling the free magnetization to the magnetic fields, the MRAM cell typically is positioned at an intersection of the first and second current lines and preferably in an intermediate position therebetween.

The method according to one embodiment of the invention further includes switching of the free magnetization between the same and opposite directions with respect to the fixed magnetization by making first and second currents to flow through the first and second current lines. Thereby, it is considered to be a feature that (concerning different switching actions) the flowing directions of both first and second currents for the switching of above free magnetization are inverted in such a way that a time-averaged mean value of the first current and a time-averaged mean value of the second current both become essentially equal to zero.

Switching of the free magnetization is not limited to a specific switching scenario, it rather is intended that each switching mechanism may be used for switching the MRAM cell as long as respective mean values of the switching currents made to flow through the first and second current lines are inverted such that they are essentially equal to a zero mean value. Upon doing so, each one of the first and second current lines experiences a zero net current on the average over time, thus resulting in a strongly inhibited electromigration phenomenon. Hence, it becomes possible to down-scale MRAM cells, especially realizing a minimum feature size of about 65 nm or below, without being forced to also down-scale switching currents due to the undesired electromigration phenomenon which otherwise is likely to occur. Accordingly, as a particular advantage, convenient switching scenarios well-known to the skilled persons may further be used in a modified way as suggested by the invention for the switching of the down-scaled MRAM cells.

As an example of such convenient switching scenario, Stoner-Wohlfahrt-switching is now explained. In Stoner-Wohlfahrt-switching, assuming that the easy-axis (axis of easy magnetization) of an MTJ corresponds to the Y-direction, and a first current line (e.g., write bit line) runs in the Y-direction and a second current line (e.g., write word line) runs in the X-direction, then, in a write mode, a current that flows in one direction is supplied to the write word line and a current that flows in one or the other direction is applied to the write bit line. When a current that flows in one direction is supplied to the write bit line, the magnetization direction of the MTJ is set in the parallel state, while, when a current that flows in the other direction is supplied to the write bit line, the magnetization direction of the MTJ is set in the antiparallel state. Supplying the write bit and word line currents, the composed magnetic field having a magnetic field in the easy axis direction $H_Y$ and a magnetic field in the hard axis direction $H_X$ is applied to the MTJ.

In order to achieve switching of the free switchable magnetic moment vector, a critical magnetic field value of the composed magnetic field, which is also referred to as reversal magnetic field has to be applied. The value of the reversal magnetic field can be determined from a minimum energy condition. If a magnetic field is applied not only in the direction of the easy axis of the free magnetization but also in the direction of the hard axis thereof, then the absolute value of the reversal magnetic field decreases. Under above assumptions, a relationship $H_X^{(2/3)}+H_Y^{(2/3)}=H_C^{(2/3)}$ is established, where $H_C$ represents the anisotropic magnetic field of the free layer. Since this curve forms an astroid on a $H_X$-$H_Y$-plane, it is called astroid curve. In case the sum of both magnetic fields in the easy and hard axis directions at least amounts to the reversal magnetic field, the switchable magnetic moment vector is switched.

As can be seen from the above, in conventional Stoner-Wohlfahrt-switching, the write bit line current is reversed for the switching between two logic states, while the write word line current is not reversed but rather is supplied in the same direction switching the MTJ in its parallel and anti-parallel states. Accordingly, down-scaling an MRAM cell, the electromigration phenomenon is likely to occur in using convenient Stoner-Wohlfahrt switching.

Hence, according to another embodiment of the invention, a method for switching (writing) an MRAM cell provided as above-described in the first embodiment of the invention is given, in which method (concerning different switching actions) an inversion of the flowing direction of the current supplied to the second current line (e.g., write word line) is effected in such, that a time-averaged mean value of the second current flowing through the second current line becomes essentially equal to zero. Accordingly, since the first current supplied to the first current line (e.g., write bit line) is already inverted (reversed) in conventional Stoner-Wohlfahrt-switching, additional inverting of the second current supplied to the second current line (e.g., write bit line) can advantageously prevent the electromigration phenomenon from occuring.

In recent years, a new concept of magnetoresistive tunneling junction memory cells ("toggle cells") has been proposed, wherein the magnetic free region (second magnetic region) is designed to include a number N of ferromagnetic layers that are antiferromagnetically coupled, where N is an integer greater than or equal to two and may be appropriately chosen to increase the effective magnetic switching volume of the MRAM device. See, for instance, U.S. Pat. No. 6,531,723 B1 to Engel et al., the disclosure of which is incorporated herein by reference.

According to a third embodiment of the invention, a method for switching (writing) of such toggle cells is given, which comprises providing an MRAM cell as described in the first and second embodiments, wherein the second magnetic region is designed to include a number N of ferromagnetic layers that are antiferromagnetically coupled, where N is an integer greater than or equal to two. The method according to the third embodiment of the invention further includes switching of the free magnetization between the same and opposite directions with respect to the fixed magnetization by making first and second currents to flow through the first and second current lines. Thereby, it is considered to be a feature that (concerning different switching actions) the flowing directions of both first and second currents for the switching of above free magnetization are inverted in such a way that a time-averaged mean value of the first current and a time-averaged mean value of the second current become essentially equal to zero. According to the third embodiment of the invention, switching of the free magnetization is not limited to a specific switching mechanism, it rather is intended that each switching mechanism may be used for switching the MRAM cell as long as the mean values of currents made to flow through the first and second current lines are inverted in such, that they are essentially equal to a zero mean value resulting in a zero net current through the current lines, when averaged over sufficiently many switching events.

In prior art, for switching of such toggle cells having a free magnetic region including antiferromagnetically coupled ferromagnetic layers it is considered to use the "adiabatic rotational switching"—mechanism. The adiabatic rotational switching mechanism is, for example, disclosed in U.S. Pat. No. 6,545,906 B1 to Savtchenko et al., the disclosure of which is incorporated herein by reference.

One major difference between convenient Stoner-Wohlfarth-switching and convenient adiabatic rotational switching is given by the fact that the latter one typically uses only uni-directional currents applied to both write bit and write word lines. More specifically, adiabatic rotational switching relies on the "spin-flop" phenomenon, which lowers the total magnetic energy in an applied magnetic field by rotating the magnetic moment vectors of the magnetic free region ferromagnetic layers.

Reference to FIG. 1A, where a typical stability diagram for an adiabatic rotation switchable MRAM toggle cell is illustrated, the abscisse of which represents the write bit line current $I_{BL}$ creating the write bit line magnetic field $H_{BL}$, while the ordinate represents the write word line current $I_{WL}$ creating the write word line magnetic field $H_{WL}$, which respectively arrive at the MRAM cell for the switching thereof. Using the spin-flop phenomenon in an MRAM cell assumed to have two antiferromagnetically coupled magnetic moment vectors $M_1$ and $M_2$ of the free magnetic region ferromagnetic layers inclined at a 45° angle to the word and bit lines, respectively, a timed sequence of applied magnetic fields in a typical "toggling write" mode, for example, is is described in the following paragraphs: At a time $t_0$ neither a write word line current nor a write bit line current are applied resulting in a zero magnetic field $H_0$ of both $H_{BL}$ and $H_{WL}$: At a time t1, the write word line current is increased to $I_1$ resulting in magnetic field $H_1$ and magnetic moment vectors $M_1$ and $M_2$ begin to rotate either clockwise or counter-clockwise depending on the direction of the write word line current: At a time $t_2$, the write bit line current $I_2$ is switched on. The write bit line current is chosen to flow in a certain direction so that both magnetic moment vectors $M_1$ and $M_2$ are further rotated in the same clockwise or counter-clockwise direction as the rotation caused by the write word line magnetic field. At this time $t_2$, both the write word and bit line currents are on, resulting in magnetic field $H_2$ with magnetic moment vectors $M_1$ and $M_2$ being nominally orthogonal to the net magnetic field direction, which is 45° with respect to the current lines.

At a time $t_3$, the write word line current $I_1$ is switched off, resulting in magnetic field $H_3$, so that magnetic moment vectors $M_1$ and $M_2$ are being rotated only by the bit line magnetic field. At this point of time, magnetic moment vectors $M_1$ and $M_2$ have generally been rotated past their hard axis instability points. Finally, at a time $t_4$, the write bit line current $I_2$ is switched off, again resulting in zero magnetic field $H_0$, and magnetic moment vectors $M_1$ and $M_2$ will align along the preferred anisotropy axis (easy axis) in a 180° angle rotated state as compared to the initial state. Accordingly, with regard to the magnetic moment vector of the reference layer, the MRAM cell has been switched from its parallel state into its anti-parallel state, or vice versa depending on the state switching ("toggling") starts off with. Hence, in convenient adiabatic rotational switching only unipolar write currents are supplied to the current lines making an electromigration phenonemon more likely to occur in case MRAM cells are down-scaled in the 65 nm minimum feature size technology or below.

Apart from the specific magnetic field sequence chosen, in order to successfully switch the MRAM cell, it is considered essential that magnetic fields applied thereon create a magnetic field path crossing a straight (in particular diagonal) line connecting a critical magnetic field value ("toggling point" or spin-flop field $H_{SF}$) for initiating toggle switching and another critical magnetic field value ("saturation point" or saturation field $H_{SAT}$) at which magnetic moment vectors of antiferromagnetically coupled ferromagnetic layers of the free magnetic region are forced to align with the applied external magnetic field in a parallel configuration. Hence, circling around the toggling point ensures that magnetic moment vectors of the antiferromagnetically coupled free layers are rotated past their hard axis instability points.

Hence, according to a fourth embodiment of the invention, a method of switching (writing to) toggle cells as provided in the third aspect of the invention is given, wherein, for switching the cell, a magnetic field sequence is applied to the cell created by supplying a first current in a first direction to one of the first and second current lines at a time $t_1$, additionally supplying a second current in a second direction to the other one of the first and second current lines at a time $t_2$, turning off the first current a time $t_3$ and turning off the second current at a time $t_4$, wherein $t_0 < t_1 < t_2 < t_3 < t_4$, such that said free magnetiziation of said second magnetic region at a time $t_4$ is oriented oppositely to said initial preferred direction at the time $t_0$, and wherein (concerning different switching actions) the flowing directions of both first and second currents for the switching of the free magnetization are inverted in such, that time-averaged mean values of the first and second currents become essentially equal to zero. It is considered that this increases the maximum allowed current density by a factor of about 10.

In the various aspects of the invention, the switching currents to create magnetic fields acting upon the free magnetization are inverted concerning different switching actions with respect to unipolar switching currents (bipolar switching currents need not inverted, since they are regularly inverted anyway). Inverting the switching currents, it may be preferable to invert switching currents for switching of the free magnetization periodically, for instance, after each switching action in an alternating way, or alternatively, after every two, three or more switching actions without inverting unipolar switching currents. Alternatively, it may also be preferable that switching currents for switching of the free magnetization are inverted stochastically (at random). Yet alternatively, it may also be preferable that (unipolar) switching currents for switching of the free magnetization are inverted coupled to the logic states of the memory cell. In the latter case, for instance, in every case a logic "1" is to be written, inverting of the switching current as to the case where a logic "0" is to be written, may be effected.

The term "time-averaged mean value" as used herein, is meant to refer to a mean value of currents (electric charges per period of time) which is averaged in a selected time period, which time period for averaging is appropriately chosen to enable averaging of the currents depending on the actual inverting scenario used. Hence, each time period at least includes two single switching actions of an MRAM cell where the free magnetization of the MRAM cell is switched in a parallel or anti-parallel state relative to the fixed magnetization and vice versa. However, each time period can also include several or a vast plurality of single switching actions, such as 10, 20, 100 or even more switching actions, as appropriate, to enable averaging of the inverted unipolar currents flowing trough the first and second current lines, respectively.

According to a yet further aspect of the invention, a magnetoresistive memory cell is given, comprising a magnetic tunnel junction including first and second magnetic regions made of magnetic material being stacked in a parallel, overlying relationship separated by a tunneling barrier layer made of non-magnetic material, wherein the first magnetic region exhibits a fixed magnetization adjacent the tunneling barrier layer and the second magnetic region exhibits a free magnetization adjacent the tunneling barrier layer which is free to be switched between the same and opposite directions with respect to the fixed magnetization of the first magnetic region, wherein the free magnetization being magnetically coupled to magnetic fields generated by first and second currents made to flow through first and second current lines, respectively, and wherein at least one of the first and second current lines comprises bi-directional current drivers for supplying currents in both directions of a current line. Accordingly, only the first current line or only the second current line can be provided with current drivers. Alternatively, both of the first and second current lines can be provided with current drivers. Furthermore, a control unit may be provided which can be connected to current drivers of the first and/or second current lines for driving inversion of the switching currents as appropriate.

In above memory cell, the free magnetic region may advantageously be comprised of a plurality of N ferromagnetic free layers which are antiferromagnetically coupled, where N is an integer greater than or equal to two. It particularly may be preferable to design the free magnetic region as a tri-layered structure including two ferromagnetic layers being antiferromagnetically coupled by an intermediate layer made of antiferromagnetic coupling material.

Also, in above memory cell, the fixed magnetization may be inclined in an angle of about 45° with respect to the first and second current lines, and may be in between the first and second current lines.

Other and further objects, features and advantages of the invention will appear more fully from the following description.

Referring to FIG. 1B, one exemplary embodiment of the method for switching an MRAM toggle cell of the invention is explained using a stability diagram for an adiabatic rotation switchable MRAM toggle cell, where the abscise represents the write bit line current $I_{BL}$ creating the write bit line magnetic field $H_{BL}$, while the ordinate represents the write word line current $I_{WL}$ creating the write word line magnetic field $H_{WL}$, which respectively arrive at the MRAM cell for the switching thereof, similar to the convenient stability diagram as shown in FIG. 1A.

Based on providing an MRAM toggle cell according to the third and fourth embodiments of the invention including a free magnetic region provided with a plurality of N ferromagnetic free layers which are antiferromagnetically coupled, where N is an integer greater than or equal to two, such MRAM toggle cell is switched using the first and third quadrants in the $I_{WL}$-$I_{BL}$ plane. More specifically, switching the toggle cell using the first quadrant as in the convenient case shown in FIG. 1A, a timed sequence of applied magnetic is at follows: at a time $t_0$ neither a write word line current nor a write bit line current are applied resulting in a zero magnetic field $H_0$ of both $H_{BL}$ and $H_{WL}$. At a time t1, the write word line current $I_1$ is increased resulting in magnetic field $H_1$ and magnetic moment vectors $M_1$ and $M_2$ begin to rotate either clockwise or counter-clockwise depending on the direction of the write word line current. At a time $t_2$, the write bit line current $I_2$ is switched on. The write bit line current is chosen to flow in a certain direction so that both magnetic moment vectors $M_1$ and $M_2$ are further rotated in the same clockwise or counter-clockwise direction as the rotation caused by the write word line magnetic field. At this time $t_2$, both the write word and bit line currents are on, resulting in magnetic field $H_2$ with magnetic moment vectors $M_1$ and $M_2$ being nominally orthogonal to the net magnetic field direction, which is 45° with respect to the current lines. At a time $t_3$, the write word line current $I_1$ is switched off, resulting in magnetic field $H_3$, so that magnetic moment vectors $M_1$ and $M_2$ are being rotated only by the bit line magnetic field. At this point of time, magnetic moment vectors $M_1$ and $M_2$ have generally been rotated past their hard axis instability points. Finally, at a time $t_4$, the write bit line current $I_2$ is switched off, again resulting in zero magnetic field $H_0$, and magnetic moment vectors $M_1$ and $M_2$ will align along the preferred anisotropy axis (easy axis) in a 180° angle rotated state as compared to the initial state. Accordingly, with regard to the magnetic moment vector of the reference layer, the MRAM cell has been switched from its parallel state into its anti-parallel state, or vice versa depending on the state switching starts off with. The magnetic field path circles around the toggling point ($H_{SF}$) which ensures that magnetic moment vectors of the antiferromagnetically coupled free layers are rotated past their hard axis instability points.

According to the invention, concerning another switching action being different from the above-described switching action, the flowing directions of both the write word line and write bit line currents for the switching of the free magnetization are inverted in such, that time-averaged mean values of the write word line and write bit line currents become essentially equal to zero. Inverting the write word line and write bit line currents the third quadrant (as counted in a counter-clockwise direction) in the $I_{WL}$-$I_{BL}$-plane is used for switching the MRAM cell. More specifically, switching the toggle cell using the third quadrant in the $I_{WL}$-$I_{BL}$-plane a timed sequence of applied magnetic is at follows: at a time $t_0$ neither a write word line current nor a write bit line current are applied resulting in a zero magnetic field $H_0$ of both $H_{BL}$ and $H_{WL}$. At a time t1, the write word line current is increased to $-I_1$ resulting in magnetic field $H_1'$ and magnetic moment vectors $M_1$ and $M_2$ begin to rotate either clockwise or counter-clockwise depending on the direction of the write word line current. At a time $t_2$, the write bit line current $-I_2$ is switched on. The write bit line current is chosen to flow in a certain direction so that both magnetic moment vectors $M_1$ and $M_2$ are further rotated in the same clockwise or counter-clockwise direction as the rotation caused by the write word line magnetic field. At this time $t_2$, both the write word and bit line currents are on, resulting in magnetic field $H_2'$ with magnetic moment vectors $M_1$ and $M_2$ being nominally orthogonal to the net magnetic field direction, which is 45° with respect to the current lines. At a time $t_3$, the write word line current $-I_1$ is switched off, resulting in magnetic field $H_3'$, so that magnetic moment vectors $M_1$ and $M_2$ are being rotated only by the bit line magnetic field. At this point of time, magnetic moment vectors $M_1$ and $M_2$ have generally been rotated past their hard axis instability points. Finally, at a time $t_4$, the write bit line current $-I_2$ is switched off, again resulting in zero magnetic field $H_0$, and magnetic moment vectors $M_1$ and $M_2$ will align along the preferred anisotropy axis (easy axis) in a 180° angle rotated state as compared to the initial state. Accordingly, with regard to the magnetic moment vector of the reference layer, the MRAM cell has been switched from its parallel state into its anti-parallel state, or vice versa depending on the state switching starts off with. The magnetic field path circles around the toggling point ($H_{SF}'$) which ensures that magnetic moment vectors of the antiferromagnetically coupled free layers are rotated past their hard axis instability points.

Using the first or third quadrant for switching the MRAM cell can be done periodically, for instance, after each switching action in an alternating way, or alternatively, after every two, three or more switching actions without inverting unipolar switching currents. Yet alternatively, using the first or third quadrant for switching the MRAM cell can be done stochastically or coupled to the logic states of the memory cell.

Now referring to FIGS. 2 and 3, two system configurations for realizing the method of the invention are described. Referring to FIG. 2, a configuration is illustrated, wherein an MRAM cell is provided in between a write word line (WL) and a write bit line (BL) at an intersection thereof. For the sake of simplicity, the MRAM cell is not explicitly illustrated in FIG. 2 but is illustrated in FIG. 3. The MRAM cell 1 comprises a magnetic tunnel junction 2 including first and second magnetic regions made of magnetic material being stacked in a parallel, overlying relationship separated by a tunneling barrier layer made of non-magnetic material. The first magnetic region exhibits a fixed magnetization adjacent the tunneling barrier layer and the second magnetic region exhibits a free magnetization adjacent the tunneling barrier layer which is free to be switched between the same and opposite directions with respect to the fixed magnetization of the first magnetic region. Further, the free magnetization being magnetically coupled to the magnetic fields generated by the write bit and write word lines. In FIG. 2, both write bit and write word lines respectively are provided with current drivers (WL-DR+, WL-DR-; BL-DR+, BL-DR-) for enabling inversion of both write bit line and write word line currents. Additionally, a control unit (CU) is provided connected to the write word line current drivers (WL-DR+, WL-DR-) only for controlling inversion of write word line currents. Accordingly, since only the write word line current is to be inverted, the configuration as shown in FIG. 2 is particularly adapted to realize a method as described in the first and second embodiments of the invention, both of which are based on convenient Stoner-Wohlfahrt-switching.

FIG. 3 differs from FIG. 2 in that the MRAM cell 1 is designed to have a free magnetic region which is comprised of a plurality of N ferromagnetic free layers 3 which are antiferromagnetically coupled, where N is an integer greater than or equal to two. Furthermore, the control unit is connected to the write word line current drivers (WL-DR+, WL-DR-) and also to the write bit line current drivers (BL-DR+, BL-DR-) for controlling inversion of both write word line and write bit line currents. Accordingly, since both the write word line and write bit line currents are to be inverted, the configuration as illustrated in FIG. 3 is particularly adapted to realize a method as described in the third and fourth aspects of the invention, both of which are based on convenient adiabatic rotational switching, as is also described in FIG. 1B.

As can be seen from the foregoing, according to the invention, the new methods of switching MRAM cells are particularly useful for the scaling-down of magnetoresistive memory cells since the undesired electromigration phenomenon can be avoided. Using above-described methods of the invention, the practical usage of future concepts of high-dense MRAM cell arrays, particularly in the 65 nm minimum feature size technology and below, can be ensured.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:
1. A method of switching a magnetic memory comprising:
switching a free magnetization between a same and opposite directions with respect to a fixed magnetization by making first and second currents to flow through a first and second current line; and inverting flowing directions of both first and second currents for the switching of the free magnetization such that a respective time-averaged mean value of said first and second currents becomes essentially equal to zero.

2. The method of claim 1, wherein the flowing directions of the first and second currents for switching of the free magnetization are inverted periodically.

3. The method of claim 1, wherein the flowing directions of the first and second currents for switching of the free magnetization are inverted alternating as to each switching.

4. The method of claim 1, wherein the flowing directions of the first and second currents for switching of the free magnetization are inverted stochastically.

5. The methods of claim 1, wherein inverting of flowing directions of the first and second currents is coupled to logic states of the memory cell.

6. A method of switching a magnetic memory comprising:
providing a magnetic memory having a magnetic tunnel junction including first and second magnetic regions, the first magnetic region exhibiting a fixed magnetization, the second magnetic region exhibiting a free magnetization, the free magnetization being magnetically coupled to magnetic fields generated by first and second currents made to flow through first and second current lines, respectively;
switching the free magnetization between the same and opposite directions with respect to the fixed magnetization by making first and second currents to flow through the first and second current lines; and
inverting flowing directions of both first and second currents for the switching of the free magnetization such that a respective time-averaged mean value of said first and second currents becomes essentially equal to zero.

7. A method of switching a magnetoresistive memory cell comprising:
providing a memory cell having a magnetic tunnel junction including a first magnetic region and a second magnetic region made of magnetic material being stacked in a parallel, overlying relationship separated by a tunneling barrier layer made of non-magnetic material, the first magnetic region exhibiting a fixed magnetization adjacent the tunneling barrier layer, the second magnetic region exhibiting a free magnetization adjacent the tunneling barrier layer which is free to be switched between the same and opposite directions with respect to the fixed magnetization of the first magnetic region, the free magnetization being magnetically coupled to magnetic fields generated by first and second currents made to flow through first and second current lines, respectively;
switching the free magnetization between the same and opposite directions with respect to the fixed magnetization by making first and second currents to flow through the first and second current lines; and
inverting flowing directions of the first and second currents for the switching of the free magnetization such that a respective tine-averaged mean value of the first and second currents becomes essentially equal to zero.

8. A method of switching a magnetoresistive memory cell comprising the following:
providing a magnetoresistive memory cell having a magnetic tunnel junction including first and second magnetic regions made of magnetic material being stacked in a parallel, overlying relationship separated by a tunneling barrier layer made of non-magnetic material, the first magnetic region exhibiting a fixed magnetization adjacent the tunneling barrier layer, the second magnetic region exhibiting a free magnetization adjacent the tunneling barrier layer which is free to be switched between the same and opposite directions with respect to the fixed magnetization of the first magnetic region; the free magnetization being magnetically coupled to magnetic fields generated by first and second currents made to flow through first and second current lines, respectively, where the magnetic field of the first current is directed in an easy axis direction of the free magnetization and where the magnetic field of the second current is directed in a hard axis direction of the free magnetization;
switching of the free magnetization between the same and opposite directions with respect to the fixed magnetization where a first current that flows in one or the other direction is supplied to the first current line, while a second current that flows in one direction is supplied to the second current line; and
inverting of flowing directions of the second current for the switching of the free magnetization such that a time-avenged mean value of the second current becomes essentially equal to zero.

9. The method of claim 8, wherein the flowing directions of the first and second currents for switching of the free magnetization are inverted periodically.

10. The method of claim 8, wherein the flowing directions of the first and second currents for switching of the free magnetization are inverted alternating as to each switching.

11. The method of claim 8, wherein the flowing directions of the first and second currents for switching of the free magnetization are inverted stochastically.

12. The method of claim 8, wherein inverting of flowing directions of the first and second currents is coupled to logic states of the memory cell.

13. A method of switching an MRAM cell comprising:
providing an MRAM cell having a magnetic tunnel junction including a first magnetic region and a second magnetic region made of magnetic material being stacked in a parallel, overlying relationship separated by a tunneling barrier layer made of non-magnetic material, the first magnetic region exhibiting a fixed magnetization adjacent the tunneling barrier layer, the second magnetic region exhibiting a free magnetization adjacent the tunneling barrier layer which is free to be switched between the same and opposite directions with respect to the fixed magnetization of the first magnetic region, the free magnetic region being comprised of a plurality of N ferromagnetic free layers which are antiferromagnetically coupled, where N is an integer greater than or equal to two, the free magnetization being magnetically coupled to magnetic fields generated by first and second currents made to flow through first and second current lines, respectively;
switching of the free magnetization between the same and opposite directions with respect to the fixed magnetization by making first and second currents to flow through the first and second current lines; and
inverting of flowing directions of the first and second currents for the switching of the free magnetization such that a respective time-averaged mean value of the first and second currents becomes essentially equal to zero.

14. A method of switching a magnetoresistive memory cell comprising:

providing a magnetoresistive memory cell having a magnetic tunnel junction including first and second magnetic regions made of magnetic material being stacked in a parallel, overlying relationship separated by a tunneling barrier layer made of non-magnetic material, the first magnetic region exhibiting a fixed magnetization adjacent the tunneling barrier layer, the second magnetic region exhibiting a free magnetization adjacent the tunneling barrier layer which is free to be switched between the same and opposite directions with respect to the fixed magnetization of the first magnetic region and being directed in a preferred direction at a time $t_0$, the free magnetic region being comprised of a plurality of N ferromagnetic free layers which are antiferromagnetically coupled, where N is an integer greater than or equal to two, the free magnetization being magnetically coupled to magnetic fields generated by first and second currents made to flow though first and second current lines, respectively;

supplying a first current in a first direction to one of the first and second current lines at a time $t_1$, additionally supplying a second current in a second direction to the other one of the first and second current lines at a time $t_2$, turning off the first current a time $t_3$ and turning off the second current at a time $t_4$, wherein $t_0<t_1<t_2<t_3<t_4$, such that the free magnetization of the second magnetic region at a time $t_4$ is oriented oppositely to the initial preferred direction at the time $t_0$;

inverting of flowing directions of both first and second currents for the switching of the free magnetization such that a respective time-averaged mean value of the first and second currents becomes essentially equal to zero.

15. The method of claim 14, wherein the flowing directions of currents for switching of the free magnetization are inverted periodically.

16. The methods of claim 14, wherein the flowing directions of currents for switching of the free magnetization are inverted alternating as to each switching.

17. The method of claim 14, wherein the flowing directions of currents for switching of the free magnetization are inverted stochastically.

18. The method of claim 14, wherein inverting of the flowing directions of currents is coupled to logic states of the memory cell.

* * * * *